US011737289B2

United States Patent
Ando et al.

(10) Patent No.: US 11,737,289 B2
(45) Date of Patent: Aug. 22, 2023

(54) HIGH DENSITY RERAM INTEGRATION WITH INTERCONNECT

(71) Applicant: INTERNATIONAL BUSINESS MACHINES CORPORATION, Armonk, NY (US)

(72) Inventors: Takashi Ando, Eastchester, NY (US); Alexander Reznicek, Troy, NY (US); Pouya Hashemi, Purchase, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 17/247,368

(22) Filed: Dec. 9, 2020

(65) Prior Publication Data

US 2022/0181389 A1 Jun. 9, 2022

(51) Int. Cl.
*H10N 70/00* (2023.01)
*H10B 63/00* (2023.01)
(Continued)

(52) U.S. Cl.
CPC ......... *H10B 63/80* (2023.02); *G11C 13/0002* (2013.01); *H10K 19/202* (2023.02);
(Continued)

(58) Field of Classification Search
CPC . H01L 27/2463; H01L 27/285; H01L 45/122; H01L 45/1608; H01L 45/1666;
(Continued)

(56) References Cited

U.S. PATENT DOCUMENTS

| 8,395,199 B2 | 3/2013 | Nagashima |
| 9,142,770 B2 | 9/2015 | Greeley |

(Continued)

FOREIGN PATENT DOCUMENTS

| CN | 104953027 A | 9/2015 |
| CN | 109728163 A | 5/2019 |

(Continued)

OTHER PUBLICATIONS

Patents Act 1977: Combined Search Report and Examination Report under Sections 17 and 18(3), dated May 12, 2022, Your Reference: DP/P49971GB, Application No. GB2116915.6, 8 pages.
(Continued)

*Primary Examiner* — Samuel A Gebremariam
(74) *Attorney, Agent, or Firm* — Samuel A. Waldbaum

(57) ABSTRACT

A cross-bar ReRAM comprising a substrate, a plurality of first columns extending parallel to each other on the top surface of the substrate, wherein each of the plurality of the first columns includes a resistive random-access memory (ReRAM) stack comprised of a plurality of layers. A plurality of second columns extending parallel to each other and the plurality of second columns extending perpendicular to the plurality of first columns, wherein the plurality of second columns is located on top of the plurality of first columns, such that the plurality of second columns crosses over the plurality of first columns. A dielectric layer filling in the space between the plurality of first columns and the plurality of second columns, wherein the dielectric layer is in direct contact with a sidewall of each of the plurality layers of the ReRAM stack.

19 Claims, 15 Drawing Sheets

(51) Int. Cl.
*G11C 13/00* (2006.01)
*H10K 19/00* (2023.01)

(52) U.S. Cl.
CPC ......... *H10N 70/021* (2023.02); *H10N 70/061* (2023.02); *H10N 70/821* (2023.02)

(58) Field of Classification Search
CPC ............. G11C 13/0002; H10N 70/821; H10N 70/021; H10N 70/061; H10K 19/202; H10B 63/80
See application file for complete search history.

(56) References Cited

U.S. PATENT DOCUMENTS

| | | | |
|---|---|---|---|
| 9,231,201 | B2 | 1/2016 | Van Schaijk |
| 9,257,642 | B1 | 2/2016 | Chang |
| 9,412,942 | B2 | 8/2016 | Walls |
| 9,735,358 | B2 | 8/2017 | Jo |
| 10,003,014 | B2 | 6/2018 | Gaidis |
| 10,003,022 | B2 | 6/2018 | Liu |
| 2014/0098595 | A1 | 4/2014 | Kawashima |
| 2014/0175371 | A1 | 6/2014 | Karpov |
| 2016/0343937 | A1 | 11/2016 | Jo |
| 2017/0133588 | A1 | 5/2017 | Bedau |
| 2018/0145253 | A1 | 5/2018 | Zhou |
| 2018/0277601 | A1* | 9/2018 | Ahn ................. H10N 70/231 |
| 2020/0006653 | A1 | 1/2020 | Tseng |
| 2020/0194667 | A1* | 6/2020 | Park ................. H01L 27/2463 |
| 2020/0321521 | A1 | 10/2020 | Hsu |

FOREIGN PATENT DOCUMENTS

| | | |
|---|---|---|
| CN | 114613804 A | 6/2022 |
| DE | 102021129057 A1 | 6/2022 |
| GB | 2603591 A | 8/2022 |
| JP | 2022091726 A | 6/2022 |
| WO | 2019055052 A1 | 3/2019 |

OTHER PUBLICATIONS

Wong et al., "Metal-Oxide RRAM", ©2012 IEEE, vol. 100, No. 6, Jun. 2012, Proceedings of the IEEE, pp. 1951-1970.

* cited by examiner

HIGH DENSITY RERAM INTEGRATION WITH INTERCONNECT

BACKGROUND

The present invention relates generally to the field of integrated circuits, and more particularly to formation of a logic circuit and ReRAM array.

BRIEF SUMMARY

Additional aspects and/or advantages will be set forth in part in the description which follows and, in part, will be apparent from the description, or may be learned by practice of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1A:
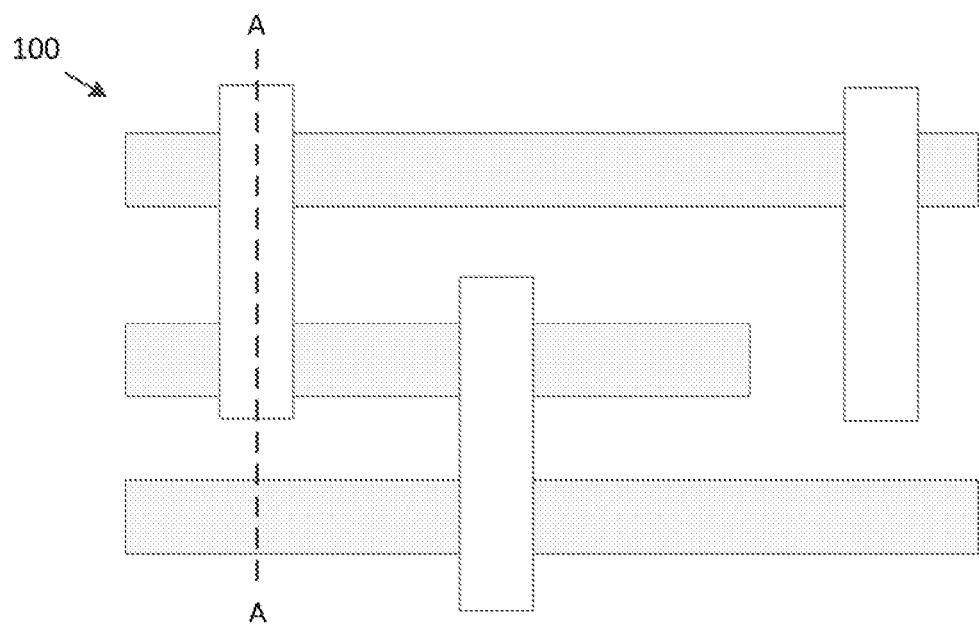
FIG. 1A illustrates a top down view of a logic array, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g. aluminum, copper, etc.) and insulators (e.g. various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Embodiments of the invention are generally directed to an apparatus and method for concurrently forming a logic circuit and a crossbar ReRAM array on the same device.

Resistive random-access memory (ReRAM) memory is integrated in higher level of BEOL interconnect, and it is desired to incorporate ReRAM into lower BEOL level. ReRAM stack typically includes TiN electrodes for compatibility with CMOS flow. Incorporation of ReRAM in Cu Damascene process requires additional metal layer (e.g. TaN) on top of ReRAM stack for protection during TiN hard mask removal. In addition, sidewall protection is needed since dimensions of Cu Via are typically larger than those of ReRAM stack pillars. A conventional spacer is damaged during a Via open process and weak spot for TiN wet etching can be created.

ReRAM is considered as a promising technology for electronic synapse devices or memristor for neuromorphic computing as well as high-density and high-speed non-volatile memory application. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of ReRAMs, which naturally expresses a fully connected neural network.

A crossbar ReRAM structure comprises ReRAM stack sandwiched between lower and upper metal lines. A first metal liner is present between the lower metal line and an underlying layer. A second metal liner is present between the upper metal line and the ReRAM stack. However, there is no metal liner on the sidewalls of the ReRAM stack and there is no metal liner on the side walls of the lower metal line. A method of forming crossbar ReRAM structure comprises forming bottom metal layer and forming a ReRAM stack over bottom metal layer. The ReRAM stack and bottom metal layer are patterned into lines and a dielectric layer is formed to fill the space between the lines. A top metal layer is formed on top of the dielectric layer and the top metal layer is etched into a second set of lines. The second set of lines runs perpendicular to the lines comprised of the lower metal layer and the ReRAM stack.

FIG. 1A illustrates a top down view of the BEOL interconnect of a logic circuit 100, in accordance with an embodiment of the present invention. The logic circuit 100 is located on the same substrate as the crossbar ReRAM array 200 and the logic circuit 100 is connected to the ReRAM array 200. The following descriptions that contain the letter "A" in the FIGS. 2-12 number refers to cross section A as illustrated in FIG. 1A. Cross section A is a perpendicular slice along three of the lower bars in the logic circuit 100 and a slice along the length of the upper bar.

Figure 1B:
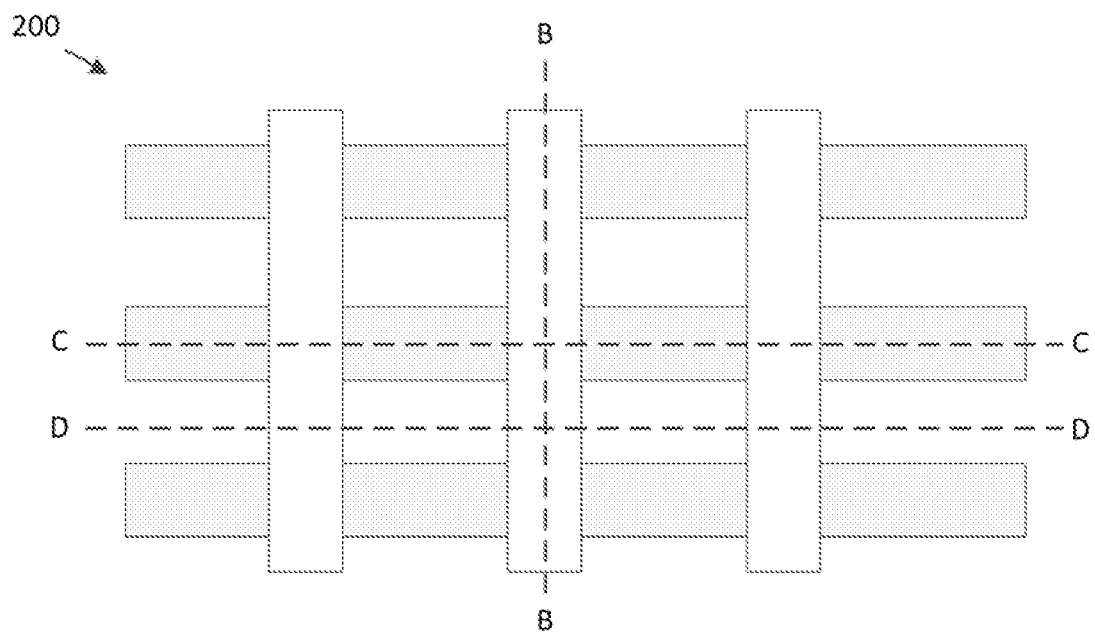
FIG. 1B illustrates a top down view of a ReRAM array, in accordance with an embodiment of the present invention.

FIG. 1B illustrates a top down view of a ReRAM array, in accordance with an embodiment of the present invention. The crossbar ReRAM array 200 is on the same substrate as the logic circuit 100. The following descriptions that contain the letter "B, C, or D" in the FIGS. 2-12 number refers to cross section B, C, or D as illustrated in FIG. 1B. Cross section B is slice along one of the upper pillars that runs perpendicular atop of a plurality of lower pillars. Cross section C is slice along one of the lower pillars that runs perpendicular below a plurality of upper pillars. Cross section D is a slice along the space between two of the lower pillars where a plurality of the upper pillars cross.

Figure 2A:
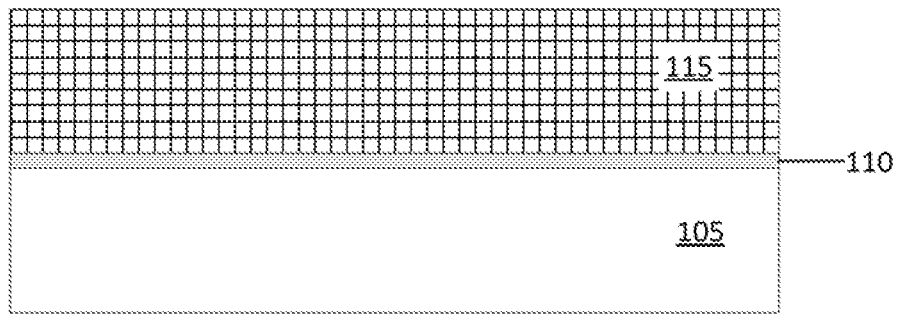
FIG. 2A illustrates cross section A of the Logic circuit during fabrication, in accordance with an embodiment of the present invention.

FIG. 2A illustrates cross section A of the logic circuit 100 during fabrication, in accordance with an embodiment of the present invention.

An underlying device 105 serves as the base for the logic circuit 100. The underlying device 105 can consist of, for example, a substrate, a silicon wafer, a sapphire wafer, MOS device, CMOS device, BTJ device, diodes, resistors, capacitors, metal layers, dielectric layers, or any type of material for the logic circuit 100 to be fabricated on. The first metal liner 110 is formed on top of the underlying device 105 through appropriate deposition techniques. The material of the first metal liner 110 may include, for example, TiN, TaN, TiC, TiAlC, or another suitable material. The first metal layer 115 is formed on top of the first metal liner 110 through appropriate deposition techniques. The material of the first metal layer 115 may include, for example, Ru, W, Cu, Al, Co, or another suitable metal layer.

Figure 2B:
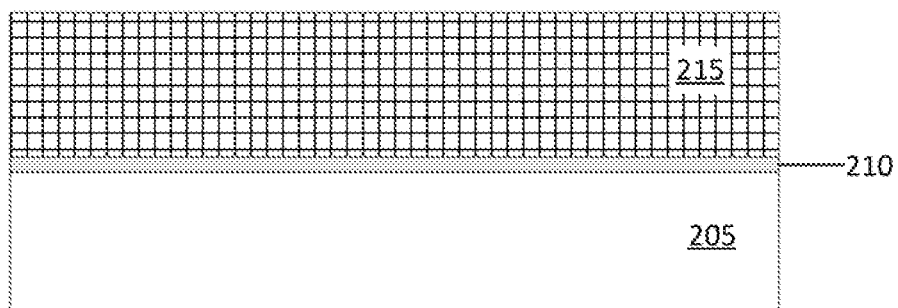
FIG. 2B illustrates cross section B of the ReRAM array during fabrication, in accordance with an embodiment of the present invention.

FIG. 2B illustrates cross section B of the ReRAM array 200 during fabrication, in accordance with an embodiment of the present invention.

An underlying device 205 serves as the base for the ReRAM array 200. The underlying device 105 can be, for example, a substrate, a silicon wafer, a sapphire wafer, MOS device, CMOS device, BTJ device, diodes, resistors, capacitors, metal layers, dielectric layers, or any type of material for the ReRAM array 200 to be fabricated on. The figures illustrate that the ReRAM array 200 and the logic circuit 100 are fabricated on same underlying device 105, 205. However, ReRAM array 200 and the logic circuit 100 may be fabricated on separate underlying devices 105, 205. The first metal liner 210 is formed on top of the underlying device 105 through appropriate deposition techniques. The material of the first metal liner 210 may include, for example, TiN, TaN, TiC, TiAlC, or another suitable material. The first metal layer 215 is formed on top of the first metal liner 210 through appropriate deposition techniques. The material of the first metal layer 215 may include, for example, Ru, W, Cu, Al, Co, or another suitable metal layer.

Figure 3A:
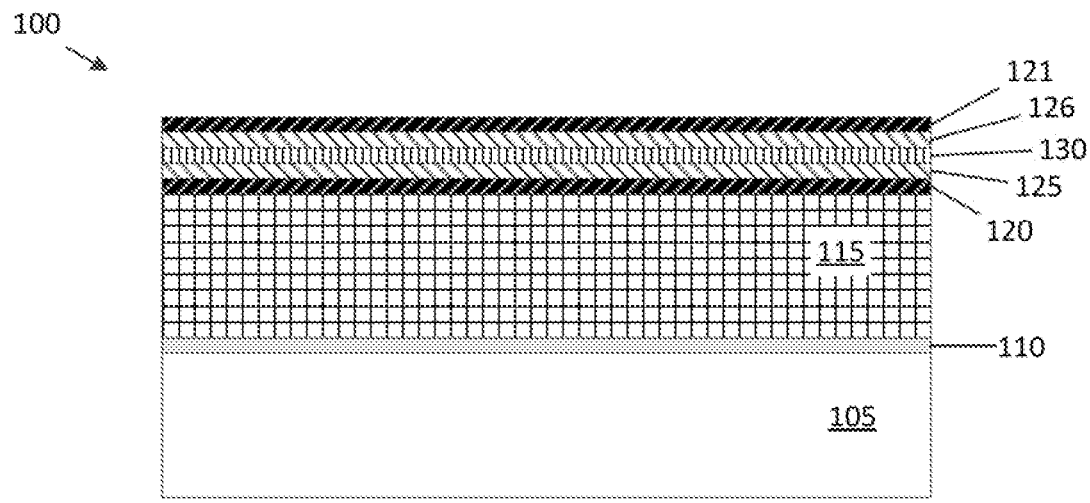
FIG. 3A illustrates cross section A of the Logic circuit during fabrication, in accordance with an embodiment of the present invention.
Figure 3B:
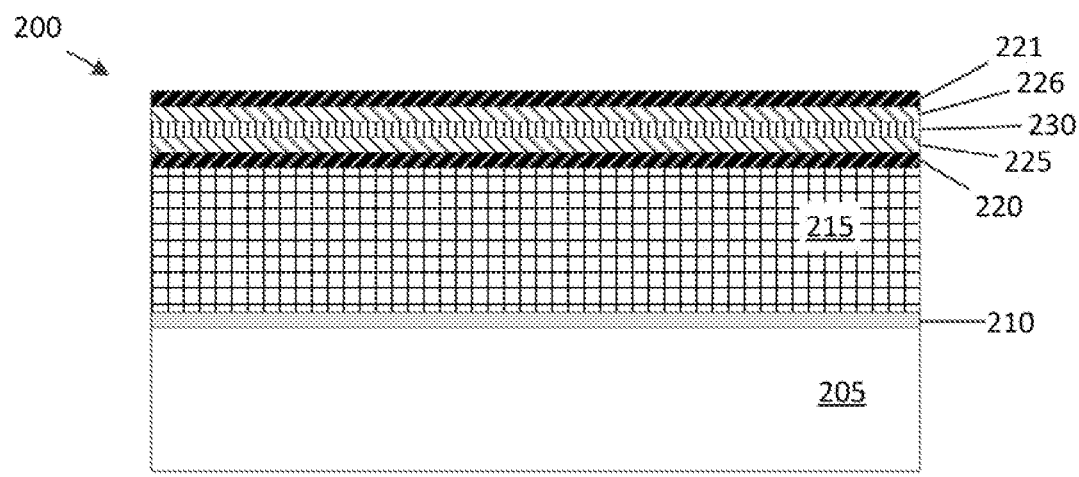
FIG. 3B illustrates cross section B of the ReRAM array during fabrication, in accordance with an embodiment of the present invention.

FIG. 3A illustrates cross section A of the logic circuit 100 during fabrication, in accordance with an embodiment of the present invention. FIG. 3B illustrates cross section B of the ReRAM array during fabrication, in accordance with an embodiment of the present invention. The ReRAM stack is comprised of a plurality of layers that are formed on top of the first metal layer 115, 215 during the same process. The ReRAM stack is composed of a first layer 120, 220, a second layer 125, 225, a third layer 130, 230, a fourth layer 126, 226, and a fifth layer 121, 221. The first layer 120, 220 and the fifth layer 121, 221 are composed of the same material, for example, TaN. The second layer 125, 225 and the fourth layer 126, 226 are composed of the same material for example TiN. The third layer 130, 230 can be comprised of, for example, $HfO_2$. These materials listed for the ReRAM stack are only meant to for illustrative purposes only and are not meant to be limiting. Any type of material that can be used to form a ReRAM stack can be utilized here.

Figure 4A:
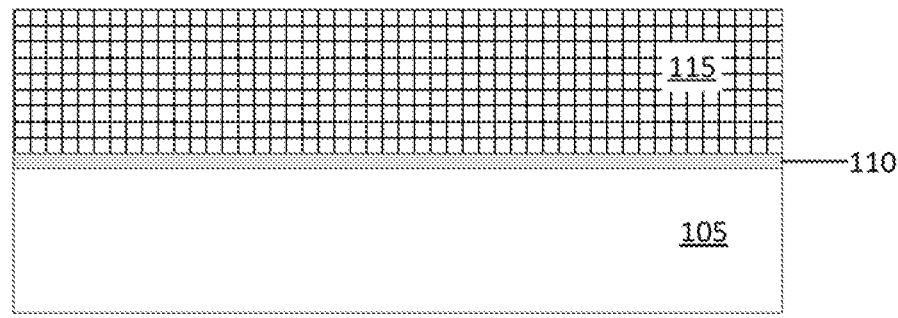
FIG. 4A illustrates cross section A of the Logic circuit during fabrication, in accordance with an embodiment of the present invention.

FIG. 4A illustrates cross section A of the logic circuit 100 during fabrication, in accordance with an embodiment of the present invention. The ReRAM stack was formed uniformly across the logic circuit 100 and the ReRAM array 200. ReRAM stack is removed from the logic circuit 100 region using appropriate etching process, since the ReRAM stack is not need in the logic circuit 100. This is achieved by forming a patterning mask, such as optical planarization layer (OPL) over the devices, followed by lithography process to define the region where the ReRAM stack will be removed, followed by etching away the OPL and also the ReRAM stack in that region, and the first metal layer 115 is exposed after that.

Figure 4B:
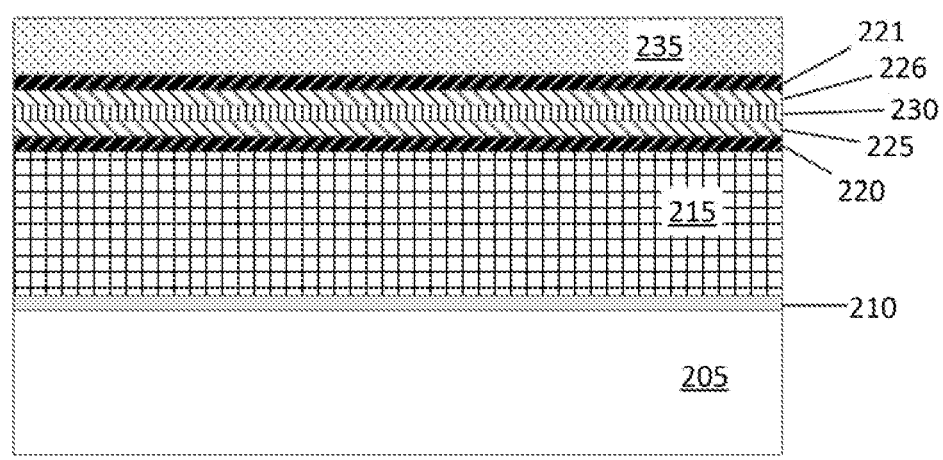
FIG. 4B illustrates cross section B of the ReRAM array during fabrication, in accordance with an embodiment of the present invention.

FIG. 4B illustrates cross section B of the ReRAM array 200 during fabrication, in accordance with an embodiment of the present invention. As described in previous paragraph, the optical planarization layer 235 is not removed in ReRAM array region on top of the fifth layer 221. The optical planarization layer 235 protects the ReRAM stack from being damaged as the ReRAM layers are being removed from the logic circuit 100 region.

Figure 5A:
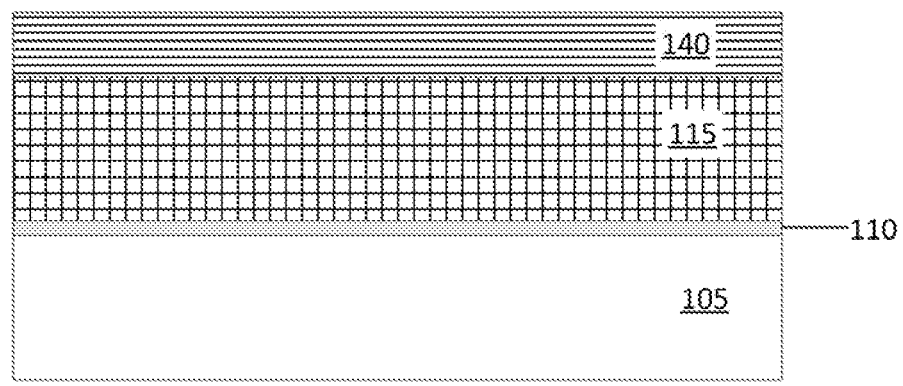
FIG. 5A illustrates cross section A of the Logic circuit during fabrication, in accordance with an embodiment of the present invention.

FIG. 5A illustrates cross section A of the logic circuit 100 during fabrication, in accordance with an embodiment of the present invention. A hard mask 140 is formed on the top surface of first metal layer 115. The material of the hard mask 140 may include, for example, SiO$_2$, SiN, SiBCN, SiCO, SiC, or other suitable hard mask materials. The hard mask 140 is planarized by CMP to make the top of the hard mask 140 planar with the top of the fifth layer 221 of the ReRAM stack.

Figure 5B:
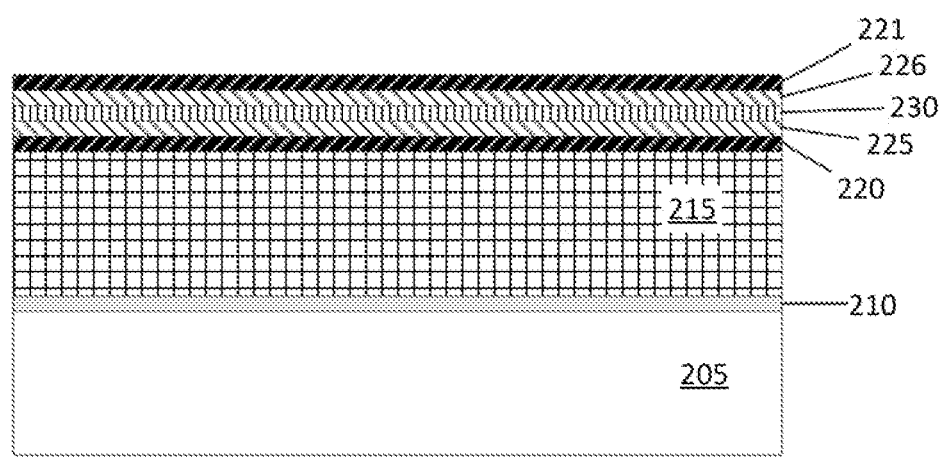
FIG. 5B illustrates cross section B of the ReRAM array during fabrication, in accordance with an embodiment of the present invention.

FIG. 5B illustrates cross section B of the ReRAM array 200 during fabrication, in accordance with an embodiment of the present invention. The optical planarization layer 235 is removed to expose the surface of the fifth layer 221. After that, the hard mask 140 is deposited on top of the fifth layer 221 of the ReRAM stack. The combined height of the hard mask 140 and the ReRAM stack is higher than the top surface of the hard mask 140 located on the logic circuit 100. Since the hard mask between the logic circuit 100 and the ReRAM array 200 are at different height it affects the downstream processing of the components. Therefore, a CMP process is applied to polish away the hard mask 140 material over the fifth layer 221, such that the top surface of the fifth layer 221 is planar with the top surface of hard mask 140.

Figure 6A:
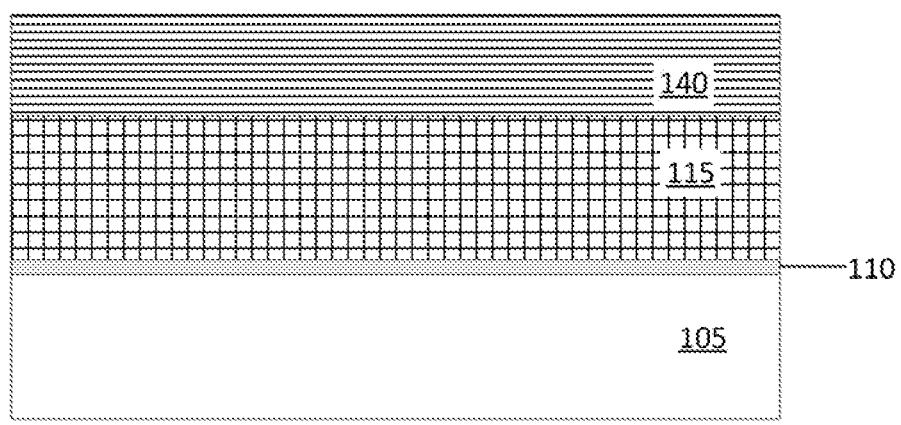
FIG. 6A illustrates cross section A of the Logic circuit during fabrication, in accordance with an embodiment of the present invention.

FIG. 6A illustrates cross section A of the Logic array 100 during fabrication, in accordance with an embodiment of the present invention. Additional hard mask material is deposited on top of the hard mask 140 to allow the formation of a hard mask 240 on top of the ReRAM stack while maintaining the planar top surface between the logic circuit 100 the ReRAM array 200. Therefore, the thickness of the hard mask 140 increases with the additional hard mask material.

Figure 6B:
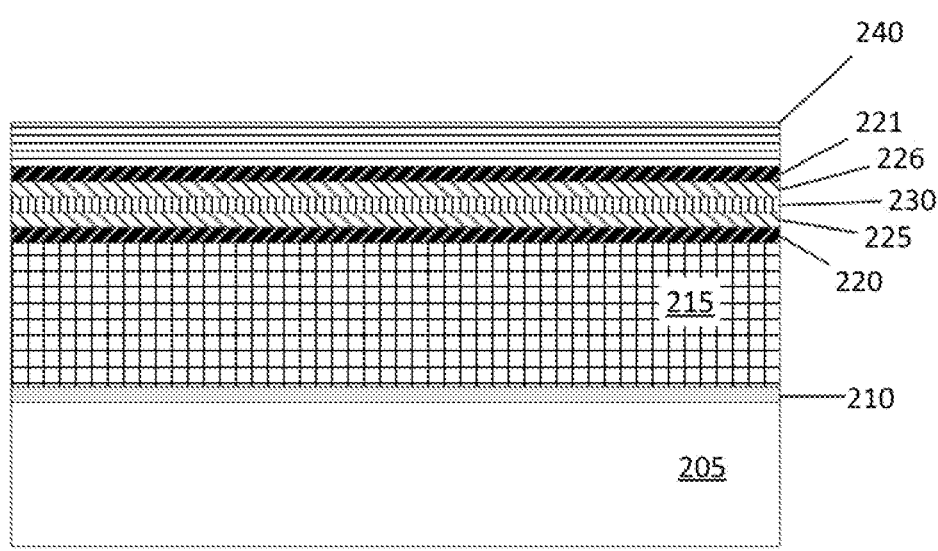
FIG. 6B illustrates cross section B of the ReRAM array during fabrication, in accordance with an embodiment of the present invention.

FIG. 6B illustrates cross section B of the ReRAM array 200 during fabrication, in accordance with an embodiment of the present invention. A hard mark 240 is formed on top of the fifth layer 221. The formation of hard mask 240 causes the thickness of the hard mask 140 to increase. Hard mask 240 is formed is needed on top of the ReRAM stack since the hard mask 240 is necessary for the patterning of the layers.

Figure 7A:
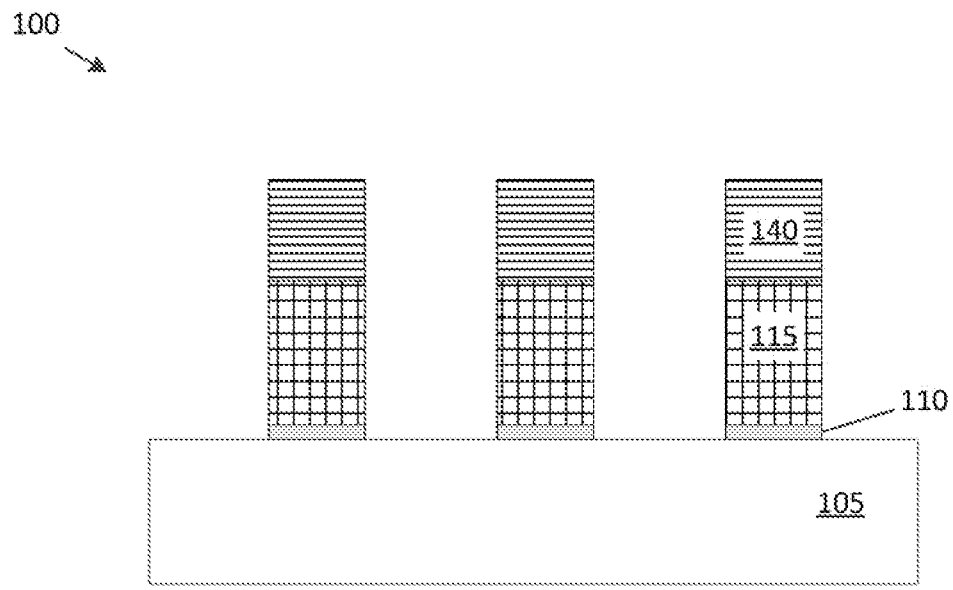
FIG. 7A illustrates cross section A of the Logic circuit during fabrication, in accordance with an embodiment of the present invention.

FIG. 7A illustrates cross section A of the logic circuit 100 during fabrication, in accordance with an embodiment of the present invention. The hard mask 140 is pattern to determine which portions of the logic circuit 100 that will be etched to form the desired pattern. The etching process can utilize any etching tech that will remove the desired layers at the specified locations in down to the underlying layer 105. The etching process creates pillars (that extend into the foreground and background) of the multiple layers where each pillar is comprised of the first metal line 110, the first metal layer 115, and the hard mask 140. FIG. 7A appears to give the impression that pillars only extend vertically, but FIG. 7A illustrates cross-section A of the logic circuit 100. FIG. 1A illustrates that the three pillars extend a distance to and from the area of the cross-section A.

Figure 7B:
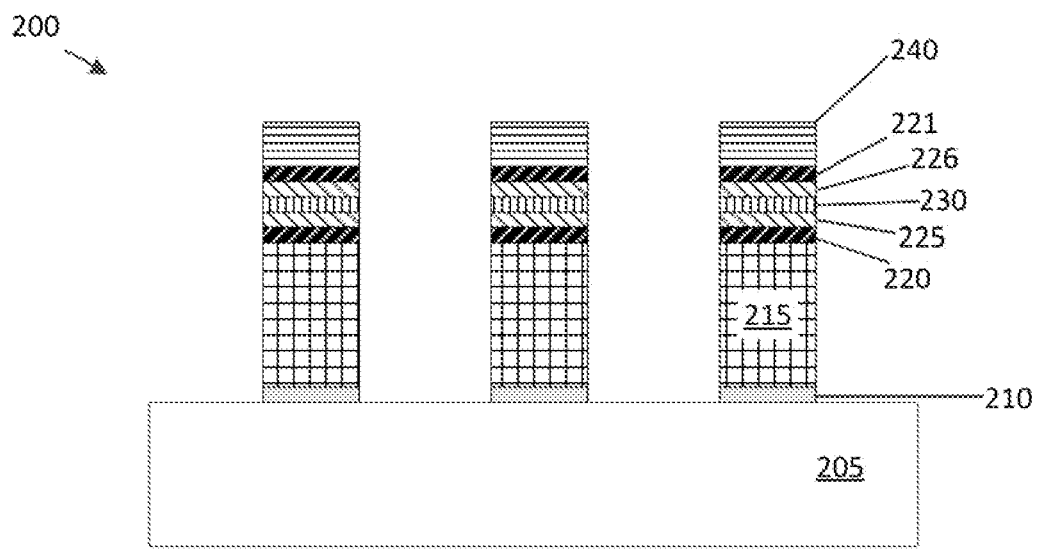
FIG. 7B illustrates cross section B of the ReRAM array during fabrication, in accordance with an embodiment of the present invention.

FIG. 7B illustrates cross section B of the ReRAM array 200 during fabrication, in accordance with an embodiment of the present invention. The hard mask 240 is pattern to determine which portions of the ReRAM array that will be etched to from the desired pattern. The etching process can utilize any etching tech that will remove the desired layers at the specified locations in down to the underlying layer 205. The etching process creates pillars (that extend into the foreground and background) of the multiple layers where each pillar is comprised of the first metal line 210, the first metal layer 215, first layer 220, second layer 225, third layer 230, fourth layer 226, fifth layer 221, and the hard mask 240. A benefit from this design is that a metal liner is not formed on the sidewalls of the pillars, meaning there is not metal liner on the sidewalls of the ReRAM stack. By not having the metal linear in direct contact with the sidewalls of each of the layers of the ReRAM stack the resistance of the ReRAM may be better controlled. Furthermore, by not having the metal liner, the damage to the underlying layers caused by the formation and patterning of the metal liner can be avoided. Furthermore, the ReRAM stack is self-aligned with the first metal layer 215, since the ReRAM stack was formed directly on first metal layer 215 prior to patterning of the pillars.

Figure 8A:
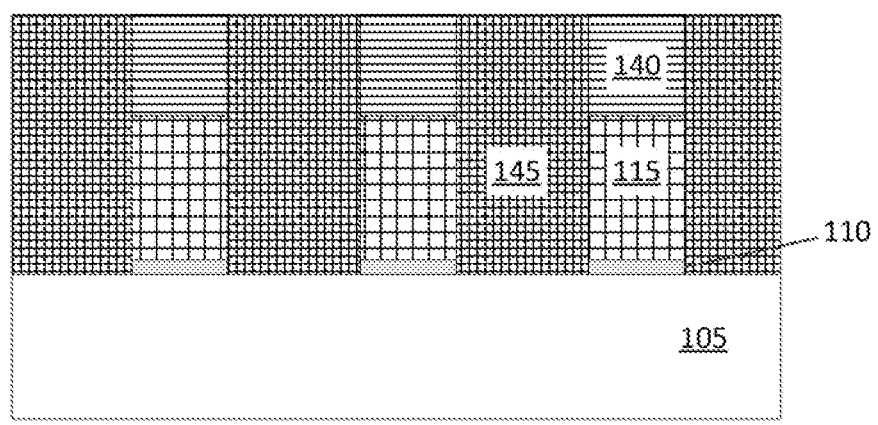
FIG. 8A illustrates cross section A of the Logic circuit during fabrication, in accordance with an embodiment of the present invention.

FIG. 8A illustrates cross section A of the logic array 100 during fabrication, in accordance with an embodiment of the present invention. A dielectric layer 145 is deposited on the logic circuit 100. The dielectric layer 145 will form on top each of the pillars during the deposition process. The dielectric layer 145 is planarized by, for example, chemical mechanical planarization (CMP), to expose the top of hard mask 140 on each of the pillars. The dielectric layer 145 is in direct contact with the sidewalls of each of the pillars on the logic circuit 100.

Figure 8B:
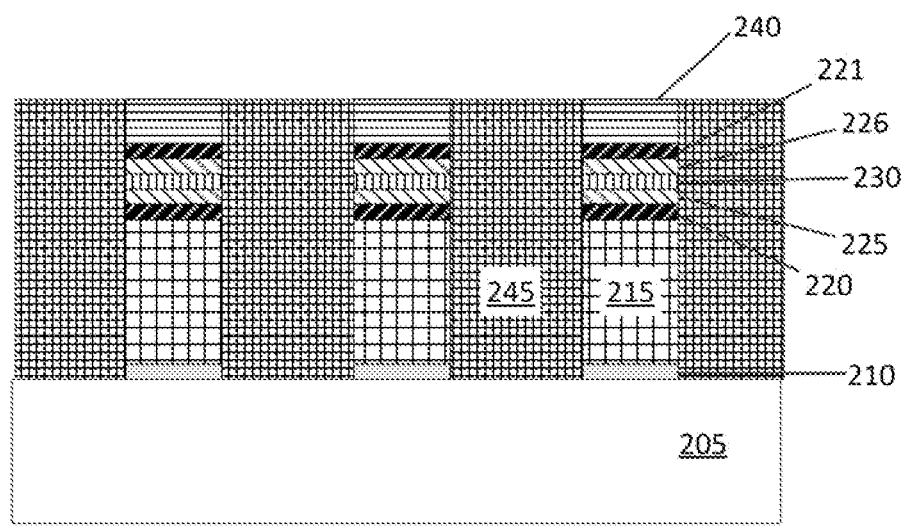
FIG. 8B illustrates cross section B of the ReRAM array during fabrication, in accordance with an embodiment of the present invention.

FIG. 8B illustrates cross section B of the ReRAM array 200 during fabrication, in accordance with an embodiment of the present invention. A dielectric layer 245 is deposited on the ReRAM array 200 to fill in the space between each of the pillars. The dielectric layer 245 is in direct contact with the sidewalls of each of the first metal layer 215, the first layer 220, the second layer 225, the third layer 230, the fourth layer 226, and the fifth layer 221. The dielectric layer 245 will form on top each of the pillars during the deposition process. The dielectric layer 245 is planarized by, for example, chemical mechanical planarization (CMP), to expose the top of hard mask 240 on each of the pillars. A benefit from this design is that a metal liner is not formed on the sidewalls of each of the pillars, which allows for the dielectric layer 245 to come into direct contact with the sidewalls of the ReRAM stack and the sidewalls of the first metal layer 215.

Figure 9A:
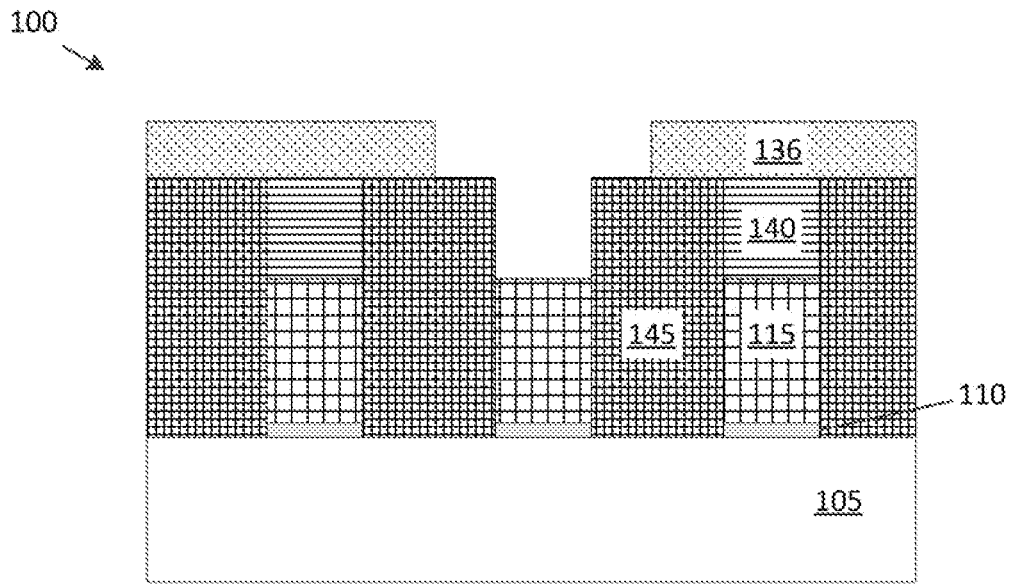
FIG. 9A illustrates cross section A of the Logic circuit during fabrication, in accordance with an embodiment of the present invention.

FIG. 9A illustrates cross section A of the logic circuit 100 during fabrication, in accordance with an embodiment of the present invention. An optical planarization layer 136 is deposited on the top surface of the dielectric layer 145 and on top of the exposed hard mask 140. Depending on the design of the logic circuit 100, portions of the optical planarization layer 136 can be removed. The removal of these portions of the optical planarization layer 136 exposed the hard mask 140. The exposed sections of hard mask 140 can be removed to expose the top surface of the first metal layer 115, as illustrated by FIG. 9A. By removing the hard mask 140 a channel is created by the dielectric layer 145 extending higher than the top of the first metal layer 115. This channel allows for the extension of the second metal layer 155 to extend downwards to make a connection with the first metal layer 215.

Figure 9B:
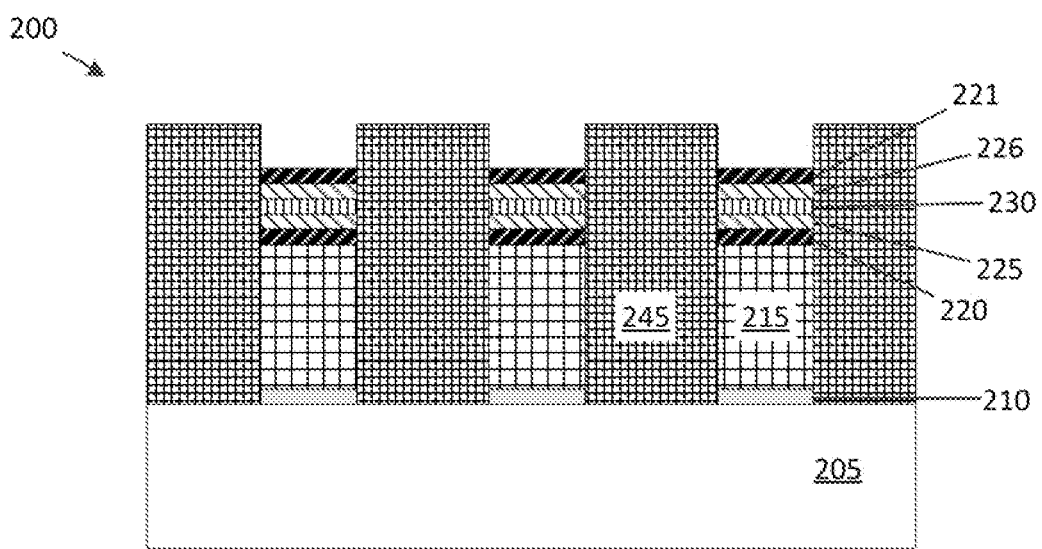
FIG. 9B illustrates cross section B of the ReRAM array during fabrication, in accordance with an embodiment of the present invention.

FIG. 9B illustrates cross section B of the ReRAM array 200 during fabrication, in accordance with an embodiment of the present invention. An optical planarization layer 136 is deposited on the top surface of the dielectric layer 245 and on top of the exposed hard mask 240. The optical planarization layer 136 is removed to expose the underlying hard mask 240 sections and the top surface of the dielectric layer 245. The exposed hard mask 240 is removed, as illustrated by FIG. 9B. By removing the hard mask 240 a channel is created by the dielectric layer 245 extending higher than the top of the fifth layer 221. These channels allow for the extension of the second metal layer 255 to extend downwards to make a connection with the ReRAM stack. Furthermore, these channels allow for the second metal layer 255 to aligned with the top of the exposed ReRAM stack.

Figure 10A:
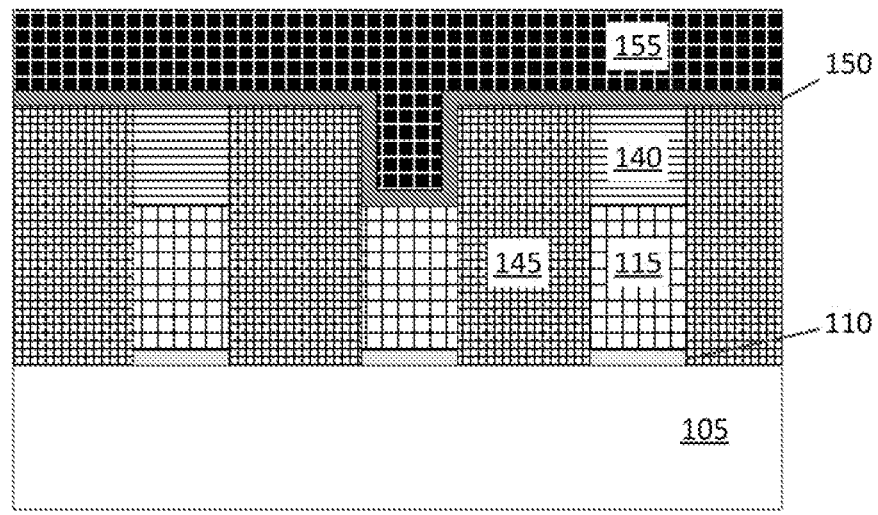
FIG. 10A illustrates cross section A of the Logic circuit during fabrication, in accordance with an embodiment of the present invention.

FIG. 10A illustrates cross section A of the logic circuit 100 during fabrication, in accordance with an embodiment of the present invention. The optical planarization layer 136 is removed to expose the top surface of the dielectric layer 145, and the top surface of the hard mask 140 that remains on some of the pillars. The thin liner layer 150 is formed on the top surface of the dielectric layer 145, the top surface of the hard mask 140, the sidewalls of the dielectric layer 145 where the hard mask 140 was removed, and on the top surface of the first metal layer 115. Thus, the thin liner layer 150 lines the channel that was created by the removal of the hard mask 140. The material of the thin liner layer 150 may include, for example, TiN, TaN, TiC, TiAlC, or another suitable material. A second metal layer 155 is formed on the top surface of the thin liner layer 150. The second metal layer 155 extends downwards into the channel and makes an electrical connection with the first metal layer 115 through the thin liner layer 150. The material of the second metal layer 155 may include, for example, Ru, W, Cu, Al, Co, or another suitable metal layer. The second metal layer 155 and the first metal layer 115 can be comprised of the same material or different material.

Figure 10B:
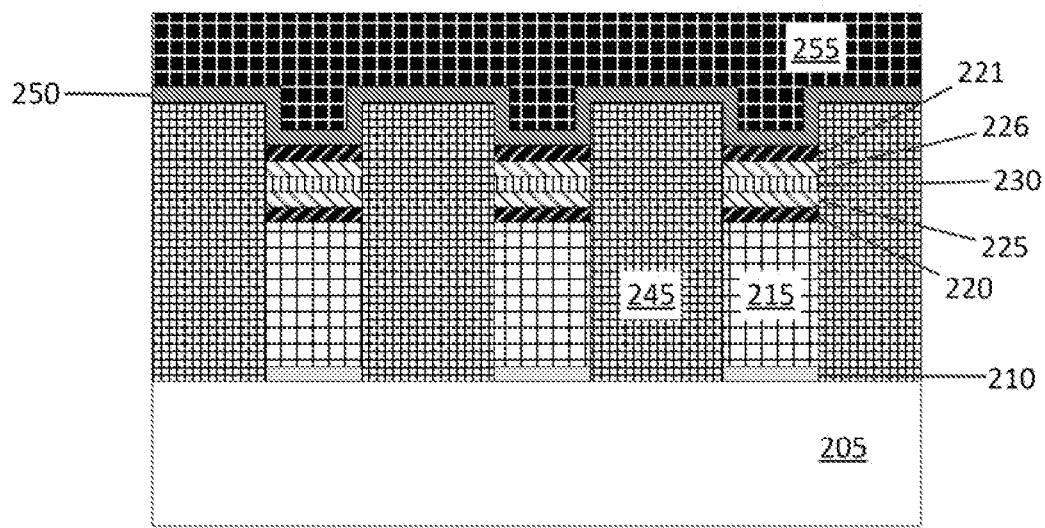
FIG. 10B illustrates cross section B of the ReRAM array during fabrication, in accordance with an embodiment of the present invention.

FIG. 10B illustrates cross section B of the ReRAM array 200 during fabrication, in accordance with an embodiment of the present invention. A thin liner layer 250 is deposited on the top surface of the dielectric layer 245, the sidewalls of the dielectric layer 245 where the hard mask 240 was removed, and on the top surface of the fifth layer 221. Thus, the thin liner layer 250 lines the channel that was created by the removal of the hard mask 240. The material of the thin liner layer 250 may include, for example, TiN, TaN, TiC, TiAlC, or another suitable material. A second metal layer 255 is formed on the top surface of the thin liner layer 250. The second metal layer 255 extends downwards into the channel and makes an electrical connection with the fifth layer 221 of the ReRAM stack through the thin liner layer 250. The material of the second metal layer 255 may include, for example, Ru, W, Cu, Al, Co, or another suitable metal layer. The second metal layer 255 and the first metal layer 215 can be comprised of the same material or different material.

Figure 10C:
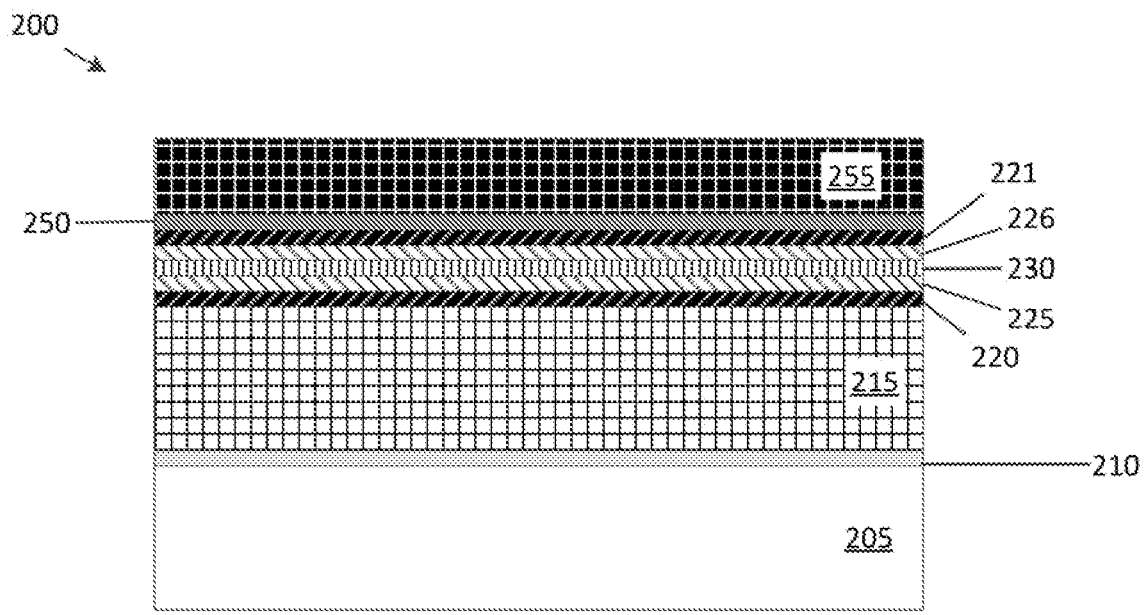
FIG. 10C illustrates cross section C of the ReRAM array during fabrication, in accordance with an embodiment of the present invention.

FIG. 10C illustrates cross section C of the ReRAM array 200 during fabrication, in accordance with an embodiment of the present invention. Cross section C of the ReRAM array 200 is perpendicular to cross section B as illustrated by FIG. 1B. A thin liner layer 250 is deposited on the top surface of the fifth layer 221. The material of the thin liner layer 250 may include, for example, TiN, TaN, TiC, TiAlC, or another suitable material. A second metal layer 255 is formed on the top surface of the thin liner layer 250. The material of the second metal layer 255 may include, for example, Ru, W, Cu, Al, Co, or another suitable metal layer. The second metal layer 255 and the first metal layer 215 can be comprised of the same material or different material.

Figure 10D:
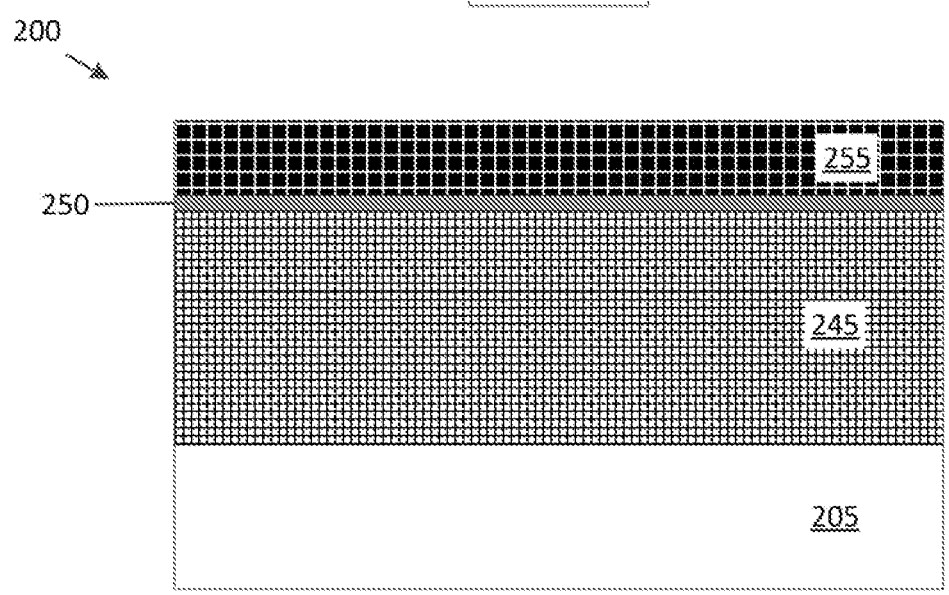
FIG. 10D illustrates cross section D of the ReRAM array during fabrication, in accordance with an embodiment of the present invention.

FIG. 10D illustrates cross section D of the ReRAM array 200 during fabrication, in accordance with an embodiment of the present invention. Cross section D of the ReRAM array 200 is parallel to cross section C. The dielectric layer 245 is formed directly on top of the underlying layer 205, the thin liner layer 250 is formed on top of the dielectric layer 245, and the second metal layer 255 is formed on top of the thin liner layer 250.

Figure 11A:
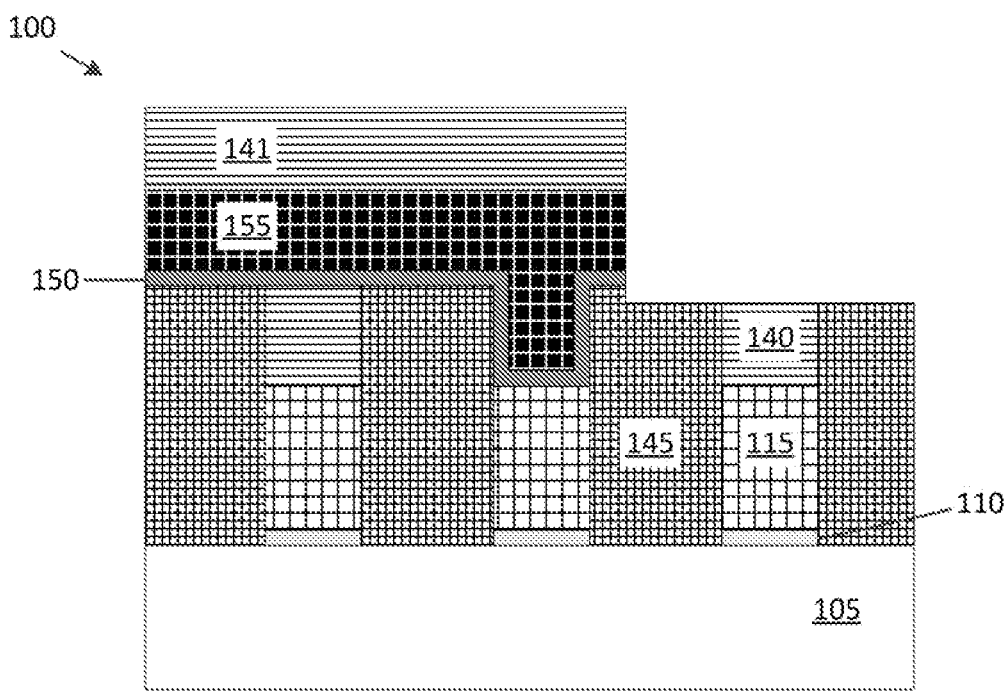
FIG. 11A illustrates cross section A of the Logic circuit during fabrication, in accordance with an embodiment of the present invention.
Figure 11B:
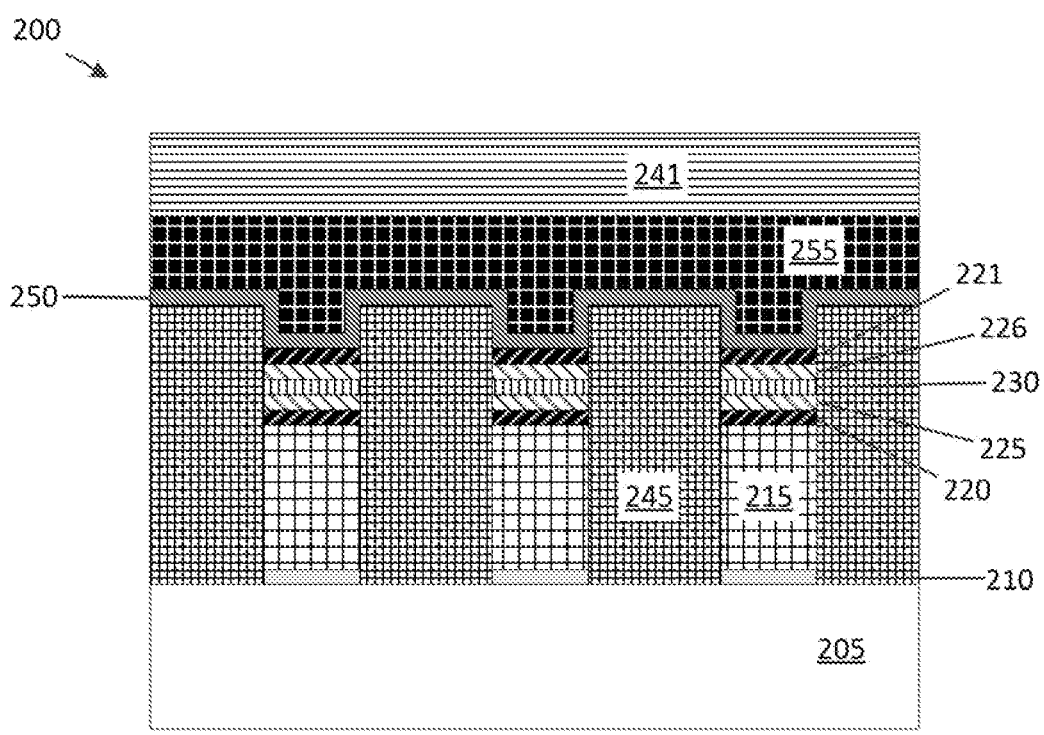
FIG. 11B illustrates cross section B of the ReRAM array during fabrication, in accordance with an embodiment of the present invention.
Figure 11C:
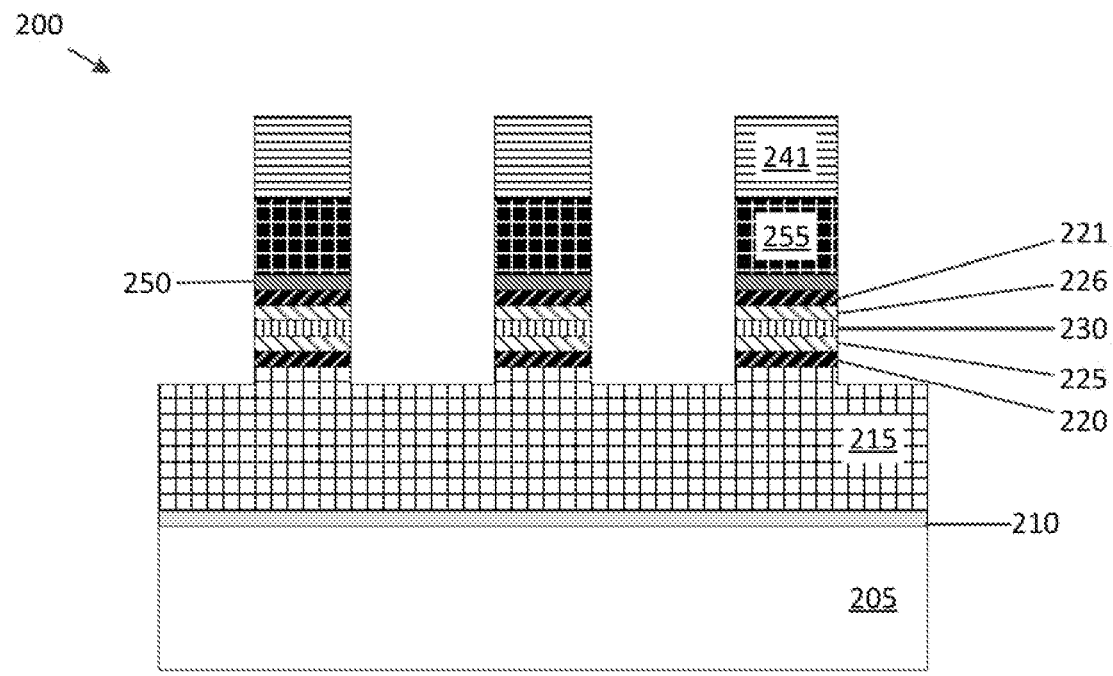
FIG. 11C illustrates cross section C of the ReRAM array during fabrication, in accordance with an embodiment of the present invention.
Figure 11D:
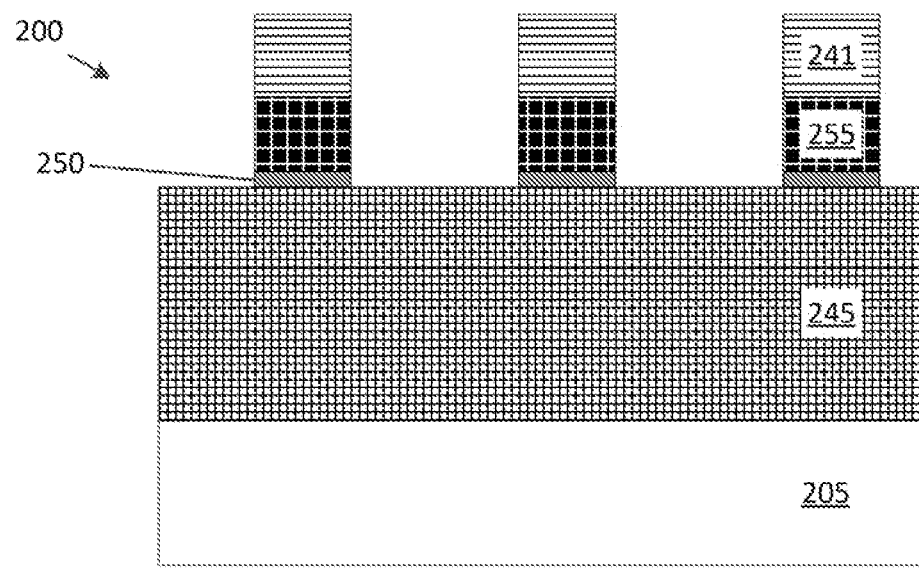
FIG. 11D illustrates cross section D of the ReRAM array during fabrication, in accordance with an embodiment of the present invention.

FIG. 11A illustrates cross section A of the logic circuit 100 during fabrication, in accordance with an embodiment of the present invention. A hard mask 141 is formed on top of the second metal layer 155. Based on the logic circuit 100 design, portions of the hard marks 141, the second metal layer 155 and the thin liner layer 150 are removed. FIG. 10A illustrates that the right section is removed, which corresponds to the section along cross section A in FIG. 1A that does not have the second metal layer 155. FIG. 11B illustrates cross section B of the ReRAM array 200 during fabrication, in accordance with an embodiment of the present invention. A hard mask 241 is formed along the top surface of the second metal layer 255. FIG. 11C illustrates cross section C of the ReRAM array 200 during fabrication, in accordance with an embodiment of the present invention. The hard mask 241 is patterned and in the areas that are not patterned the material of the underlying layers are removed. The layers are removed down to the first metal layer 215. FIG. 11C illustrates three pillars were created which corresponds to the three columns cross section C cuts across as illustrated by FIG. 1B. FIG. 11D illustrates cross section D of the ReRAM array 200 during fabrication, in accordance with an embodiment of the present invention. The hard mask 241 is patterned and the underlying layers are removed. The layers are removed down to the dielectric layer 245. FIG. 11C illustrates three pillars were created which corresponds to the three columns cross section D cuts across as illustrated by FIG. 1B. The process steps shown in FIGS. 11A-D are done simultaneously so that there only one lithography step and one etching step.

Figure 12A:
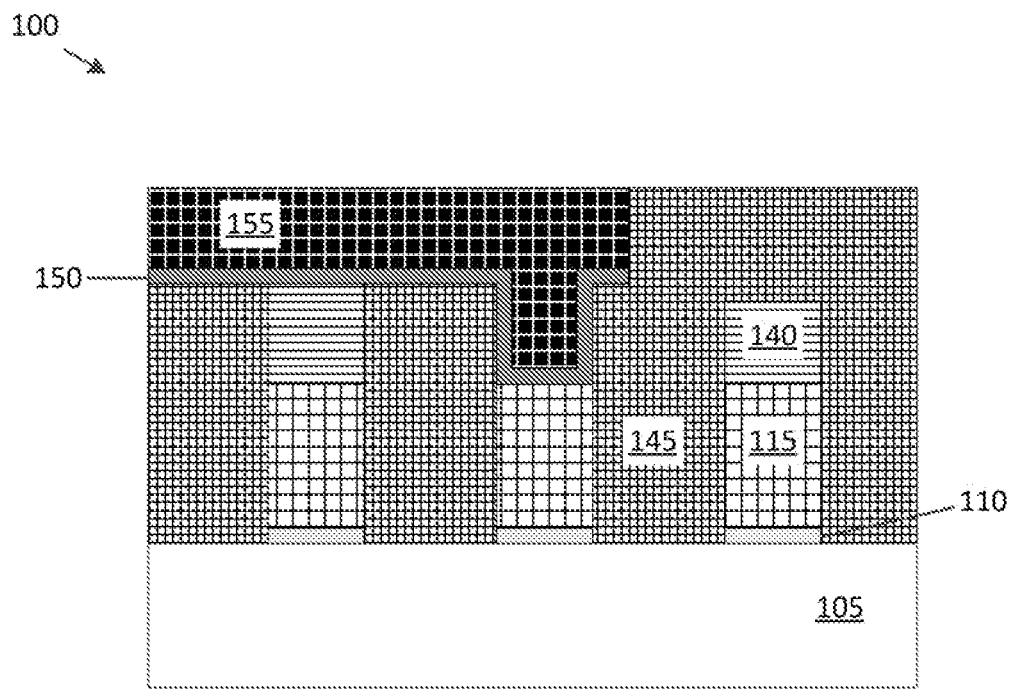
FIG. 12A illustrates cross section A of the Logic circuit during fabrication, in accordance with an embodiment of the present invention.
Figure 12B:
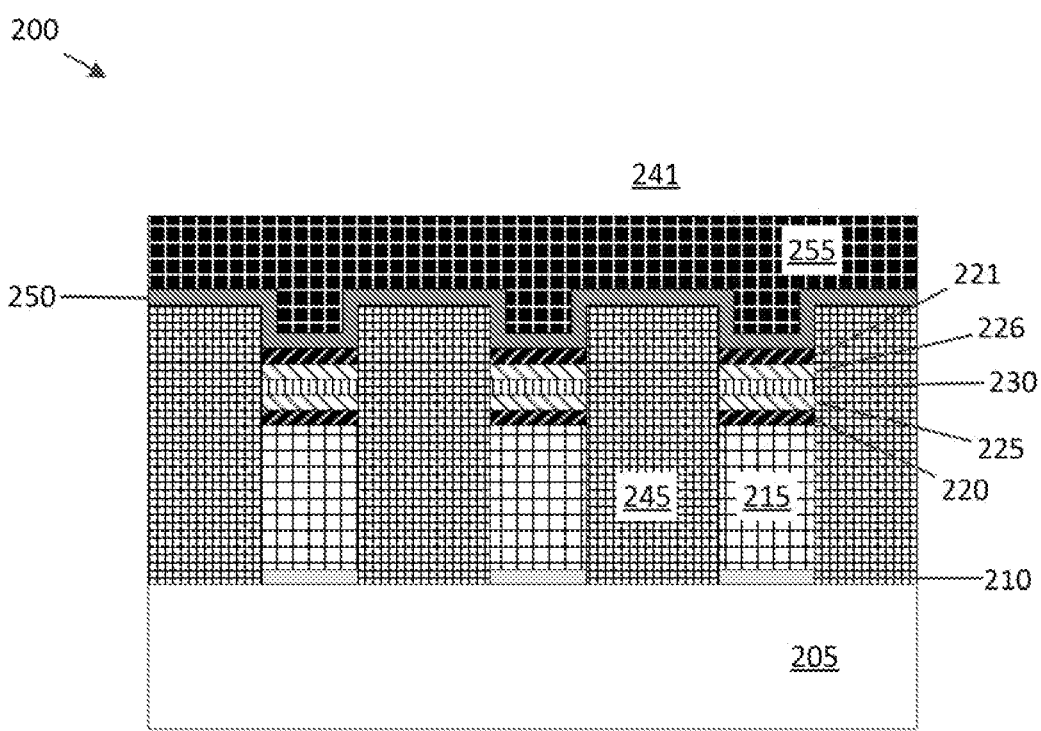
FIG. 12B illustrates cross section B of the ReRAM array during fabrication, in accordance with an embodiment of the present invention.
Figure 12C:
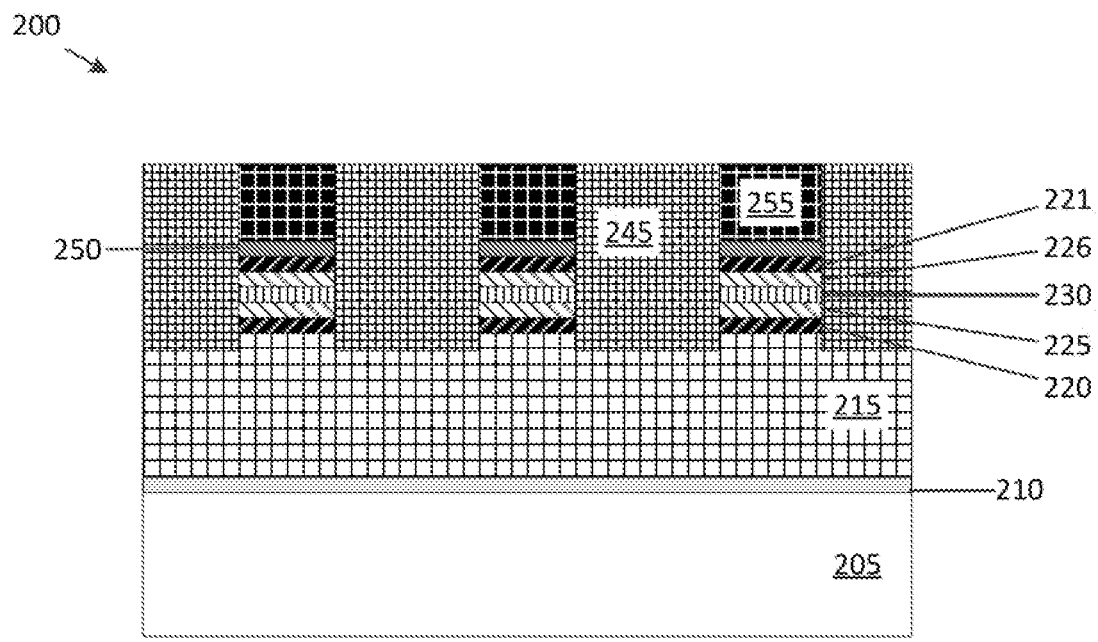
FIG. 12C illustrates cross section C of the ReRAM array during fabrication, in accordance with an embodiment of the present invention.
Figure 12D:
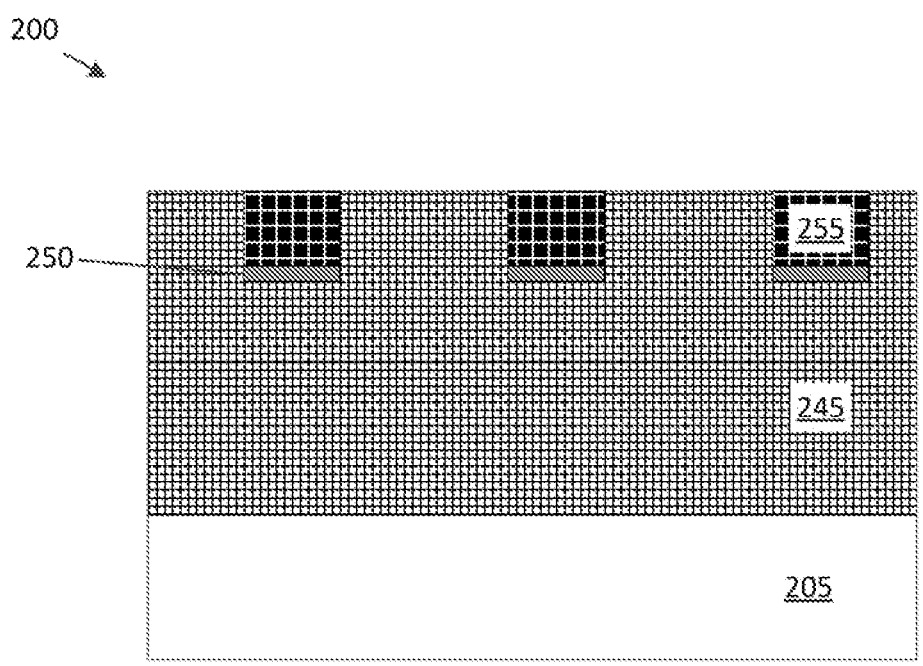
FIG. 12D illustrates cross section D of the ReRAM array during fabrication, in accordance with an embodiment of the present invention.

FIG. 12A illustrates cross section A of the logic array 100 during fabrication, in accordance with an embodiment of the present invention. Additional dielectric layer 145 is formed on top of the exposed surfaces to fill in any of the areas. The dielectric layer 145 is CMP to remove the excess material and to create a planar top surface. FIG. 12B illustrates cross section B of the ReRAM array 200 during fabrication, in accordance with an embodiment of the present invention. FIG. 12C illustrates cross section C of the ReRAM array 200 during fabrication, in accordance with an embodiment of the present invention. FIG. 12D illustrates cross section D of the ReRAM array 200 during fabrication, in accordance with an embodiment of the present invention. Additional dielectric layer 245 is formed on top of the exposed surfaces to fill in any of the areas. The dielectric layer 245 is CMP to remove the excess material and to create a planar top surface. The process steps shown in FIGS. 12A-D are done simultaneously so that there only one dielectric deposition step and only one CMP step.

The ReRAM stack formed by the process described above is aligned with the first metal layer 215 and the with the second metal layer 255. Since the ReRAM stack is self-aligned with the first and second metal layer 215 and 255, it allows for the ReRAM array 200 to be designed for different scales. Furthermore, since a metal liner is in direct or any type of contact with the sidewalls of the ReRAM stack allows for more control of the resistance of the ReRAM stack.

The above method describes the formation of the logic circuit 100 and the ReRAM array 200 occur on the same time on the same wafer. The two devices can be connected to each through with high density interconnect (not shown). This allows for the simplification of the fabrication process since the high-density interconnect can be fabricated at the same time as the logic circuit 100 and the ReRAM array 200.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An apparatus comprising:
   a substrate;
   a plurality of first columns parallel to each other and extending up from a top surface of the substrate, wherein each of the plurality of first columns includes a resistive random-access memory (ReRAM) stack comprised of a plurality of layers;
   a plurality of second columns extending parallel to each other and extending perpendicular to the plurality of first columns, wherein the plurality of second columns are located on top of the plurality of first columns such that the plurality of second columns crosses over the plurality of first columns, wherein each of the plurality of second columns includes at least one downwards extending protrusion, wherein the at least one downwards extending protrusion is in contact with one of the plurality of first columns; and
   a dielectric layer located in a space between the plurality of first columns and the plurality of second columns, wherein the dielectric layer is in direct contact with a sidewall of each of the plurality layers of the ReRAM stack.

2. The apparatus of claim 1, wherein the plurality of layers of each ReRAM stack is comprised of:
   a first layer comprised of first material;
   a second layer formed on the first layer, wherein the second layer is comprised of a second material that is different than the first material;
   a third layer formed on the second layer, wherein the third layer is comprised of a third material that is different than the first material and the second material;
   a fourth layer formed o the third layer, wherein the fourth layer is comprised of the second material; and
   a fifth layer formed on the fourth layer, wherein the fourth layer is comprised of the first material.

3. The apparatus of claim 2, wherein the first material is TaN, wherein the second material is TiN, and wherein the third material is HfO2.

4. The apparatus of claim 2, wherein the dielectric layer is in direct contact with sidewalls of the first layer, the second layer, the third layer, the fourth layer, and the fifth layer.

5. The apparatus of claim 1, wherein each of a first columns are comprised of:
   a first liner formed on the substrate;
   a first metal layer formed on the liner; and
   the ReRAM stack formed on the first metal layer.

6. The apparatus of claim 5, wherein the ReRAM stack is in direct contact with one of the pluralities of second columns.

7. The apparatus of claim 6, wherein each of the second columns is comprised of:
   a second liner formed directly on the dielectric layer and on top of the ReRAM stack; and
   a second metal layer formed directly on the second liner.

8. The apparatus of claim 6, wherein the dielectric layer extends higher than each of the first columns, creating a channel between a side wall of the dielectric layer and the top of the ReRAM stack.

9. The apparatus of claim 8, wherein each of the second columns is comprised of:
   a second liner formed directly on the dielectric layer and the top of the ReRAM stack, such that the second liner is formed on the walls of the channel; and
   a second metal layer formed directly on the second liner, such that, the second metal layer fills the channel to form the downward extending protrusion.

10. A microelectronic device comprising:
    a logic array and a ReRAM array located on a substrate;
    the ReRAM array is comprised of:
      a plurality of first columns parallel to each other and extending up from a top surface of the substrate, wherein each of the plurality of first columns includes a resistive random-access memory (ReRAM) stack comprised of a plurality of layers;
      a plurality of second columns extending parallel to each other and extending perpendicular to the plurality of first columns, wherein the plurality of second columns are located on top of the plurality of first columns such that the plurality of second columns crosses over the plurality of first columns; and
      a first dielectric layer filling in the space between the plurality of first columns and the plurality of second columns, wherein the first dielectric layer is in direct contact with a sidewall of each of the plurality layers of the ReRAM stack;
    the Logic array is comprised of:
      a plurality of third columns parallel to each other and extending up from a top surface of the substrate;
      a plurality of fourth columns extending parallel to each other and extending perpendicular to the plurality of third columns, wherein the plurality of fourth columns are located on top of the plurality of third columns such that the plurality of fourth columns crosses over the plurality of third columns, wherein the plurality of fourth columns include downwards extensions, wherein the downward extension forms a connection with one of the plurality of third columns;

a second dielectric layer filling in the space between the plurality of third columns and the plurality of fourth columns.

11. The microelectronic device of claim 10, wherein the plurality of layers of each ReRAM stack is comprised of:
    a first layer comprised of first material;
    a second layer formed on the first layer, wherein the second layer is comprised of a second material that is different than the first material;
    a third layer formed on the second layer, wherein the third layer is comprised of a third material that is different than the first material and the second material;
    a fourth layer formed on the third layer, wherein the fourth layer is comprised of the second material; and
    a fifth layer formed on the fourth layer, wherein the fourth layer is comprised of the first material.

12. The microelectronic device of claim 11, wherein the first material is TaN, wherein the second material is TiN, and wherein the third material is HfO2.

13. The microelectronic device of claim 11, wherein the first dielectric layer is in direct contact with the sidewalls of the first layer, the second layer, the third layer, the fourth layer, and the fifth layer.

14. The microelectronic device of claim 10, wherein each of a first columns are comprised of:
    a first liner formed on the substrate;
    a first metal layer formed on the liner; and
    the ReRAM stack formed on the first metal layer.

15. The microelectronic device of claim 14, wherein the ReRAM stack is in direct contact with one of the pluralities of second columns.

16. The microelectronic device of claim 15, wherein each of the second columns is comprised of:
    a second liner formed directly on the first dielectric layer and the top of the ReRAM stack; and
    a second metal layer formed directly on the second liner.

17. The microelectronic device of claim 15, wherein the first dielectric layer extends higher than each of the first columns, creating a channel between a side wall of the first dielectric layer and the top of the ReRAM stack.

18. The microelectronic device of claim 17, wherein each of the second columns is comprised of:
    a second liner formed directly on the first dielectric layer and the top of the ReRAM stack, such that the second liner is formed on the walls of the channel; and
    a second metal layer formed directly on the second liner, such that, the second metal layer fills the channel.

19. The microelectronic device of claim 11, wherein a portion of the second dielectric layer is located directly above a portion of one of the plurality of third columns, wherein the portion of the second dielectric layer is in direct contact with a sidewall of one of the plurality of columns.

* * * * *